(12) United States Patent
Lee

(10) Patent No.: US 7,450,441 B2
(45) Date of Patent: Nov. 11, 2008

(54) MEMORY SYSTEM, A MEMORY DEVICE, A MEMORY CONTROLLER AND METHOD THEREOF

(75) Inventor: Dong-yang Lee, Yongin-si (KR)

(73) Assignee: Samsung Electronics Co, Ltd, Gyeonggi-do (KR)

( * ) Notice: Subject to any disclaimer, the term of this patent is extended or adjusted under 35 U.S.C. 154(b) by 236 days.

(21) Appl. No.: 11/266,383

(22) Filed: Nov. 4, 2005

(65) Prior Publication Data

US 2006/0092721 A1    May 4, 2006

(30) Foreign Application Priority Data

Nov. 4, 2004    (KR) .................. 10-2004-0089253

(51) Int. Cl.
*G11C 7/00*    (2006.01)
(52) U.S. Cl. ............ 365/193; 365/189.05; 365/189.08; 365/191
(58) Field of Classification Search ............... 365/193, 365/189.05, 189.08, 191
See application file for complete search history.

(56) References Cited

U.S. PATENT DOCUMENTS

| | | | |
|---|---|---|---|
| 6,078,546 A | 6/2000 | Lee | |
| 6,728,162 B2 | 4/2004 | Lee et al. | |
| 6,922,367 B2 * | 7/2005 | Morzano et al. | ............ 365/193 |
| 7,123,520 B2 * | 10/2006 | Seo et al. | ............... 365/189.05 |
| 7,173,866 B2 * | 2/2007 | Na et al. | ..................... 365/193 |
| 2002/0122348 A1 | 9/2002 | Lee et al. | |
| 2004/0022095 A1 | 2/2004 | Lee | |

FOREIGN PATENT DOCUMENTS

| | | |
|---|---|---|
| DE | 102 20 559 | 11/2002 |
| KR | 10-2004-0011834 A | 2/2004 |
| WO | WO 97/08702 | 3/1997 |
| WO | WO 01/75616 A2 | 10/2001 |

OTHER PUBLICATIONS

JEDEC Standard, Double Data Rate (DDR) SDRAM Specification; JESD79D (Revision of JESD79C), Jan. 2004, JEDEC Solid State Technology Association.
English Language Translation of Office Action issued by the German Patent Office on Jul. 23, 2007.
Chinese Office Action dated Apr. 11, 2008 with English translation of the text.

* cited by examiner

*Primary Examiner*—Pho M. Luu
(74) *Attorney, Agent, or Firm*—Harness, Dickey & Pierce, PLC

(57) ABSTRACT

The memory system, memory device, memory controller and method may have a reduced power consumption. The memory system, memory device, memory controller and method may transition a data strobe signal to a valid logic level during a standby state. The valid logic level may be less than a logic level associated with a higher impedance level, such as when a bus may be turned off or connected to a ground voltage. A delay locked circuit need not be used in the memory device.

10 Claims, 8 Drawing Sheets

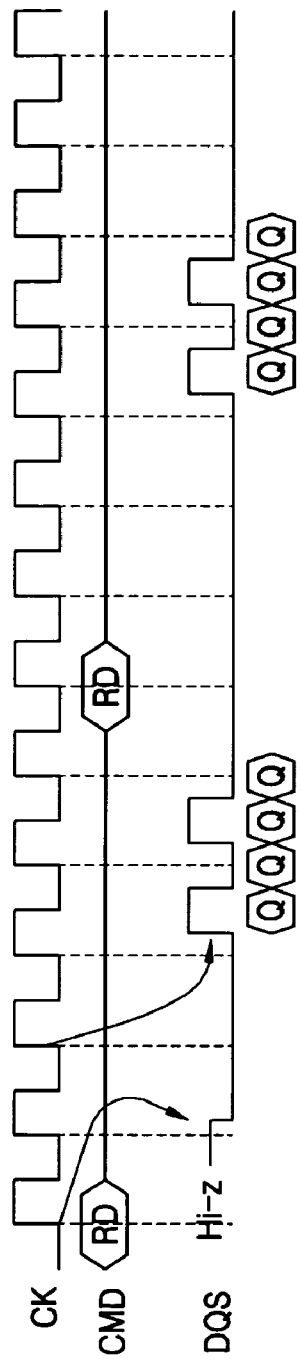
FIG. 5A • READ FOLLOWED BY A READ: BL=4, CL=3, WL=2(CL−1)
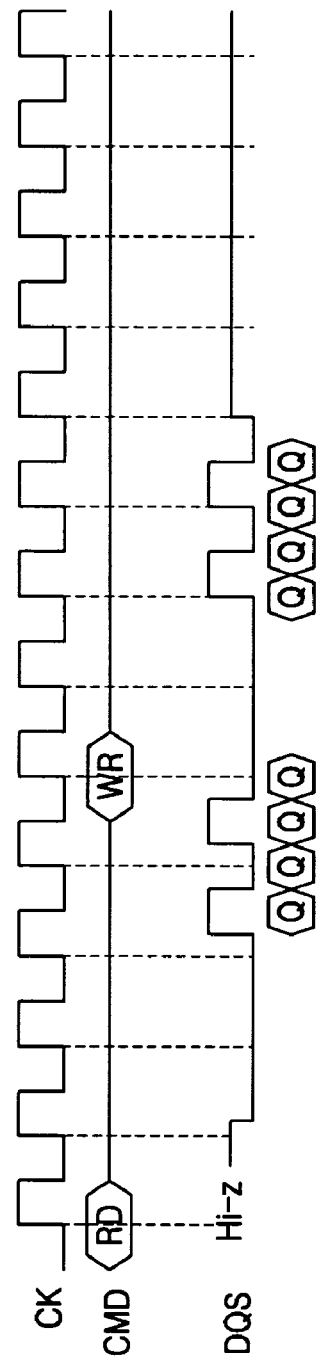
FIG. 5B • READ FOLLOWED BY A WRITE: BL=4, CL=3, WL=2(CL−1)
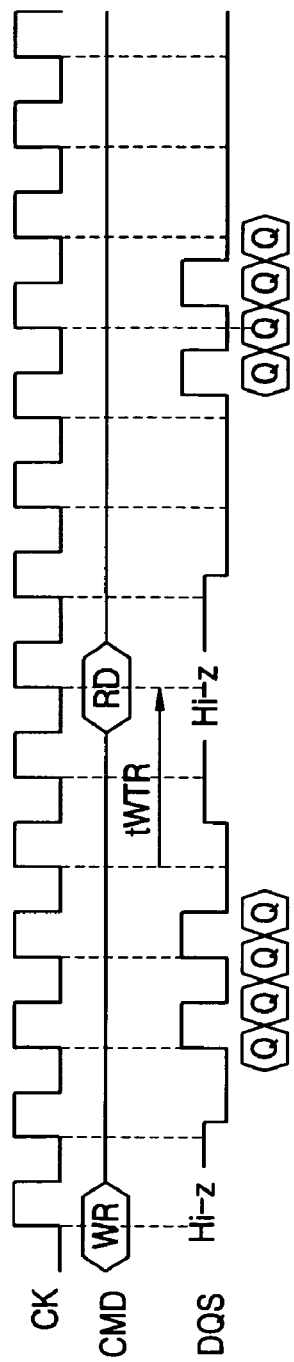
FIG. 5C • WRITE FOLLOWED BY A WRITE: BL=4, CL=3, WL=2(CL−1)

MEMORY SYSTEM, A MEMORY DEVICE, A MEMORY CONTROLLER AND METHOD THEREOF

PRIORITY STATEMENT

This application claims the benefit of Korean Patent Application No. 10-2004-0089253, filed on Nov. 4, 2004, in the Korean Intellectual Property Office, the disclosure of which is incorporated herein in its entirety by reference.

BACKGROUND OF THE INVENTION

1. Field of the Invention

The present invention is related generally to a memory system, a memory device, a memory controller and method thereof, and more particularly to a memory system, a memory device, a memory controller for reducing power consumption and method thereof.

2. Description of the Related Art

FIG. 1 illustrates a conventional memory system 100 with a center tap termination (CTT). The conventional memory system 100 may include a bus line 15 connected between a transmitter 11 and a receiver 13. The bus line 15 may be terminated at a termination voltage Vtt which may correspond to half of a power supply voltage VDD. Thus, the bus line 15 may be maintained at the reduced level of VDD/2 during a standby period without data transmissions. Noise generated on the bus line 15 (e.g., during the standby period) may be interpreted as a signal transition on the bus line 15 depending on a sensitivity of the receiver 13.

Referring to FIG. 1, the receiver 13 may be a memory device and the transmitter 11 may be a memory controller. Alternatively, the receiver 13 may be a memory controller and the transmitter 11 may be a memory device.

Referring to FIG. 1, if the receiver 13 misinterprets the noise on the bus line 15 as a signal transition, the misinterpretation of the signal transition may cause the receiver 13 to function erroneously. In order to compensate for errors in signal recognition, the receiver 13 may maintain a received signal level for a period of time before a driver of the transmitter 11 initiates a signal transition. In addition, the receiver 13 may wait until after the period of time before again interpreting the signal level on the bus line 15 to detect a signal transition. However, performance of the conventional memory system 100 may deteriorate (e.g., due to transmission delays) as the period of time increases.

FIG. 2A is a timing diagram illustrating a conventional dual data rate (DDR) synchronous dynamic random access memory (DRAM) during a write operation.

Referring to FIG. 2A, a deterioration in the DQS bus line may be reduced by inputting the data strobe signal DQS synchronously with a clock signal CK during the write operation. In an example, the conventional DDR synchronous DRAM may operate according to a well-known tDQSS protocol. Accordingly, the conventional DDR synchronous DRAM may interpret a signal transition of the data strobe signal DQS in part by counting a number of clock cycles after receiving a write command.

FIG. 2B is a timing diagram illustrating the conventional DDR synchronous DRAM of FIG. 2A during a read operation.

Referring to FIG. 2B, the conventional DDR synchronous DRAM may output data in synchronization with the clock signal CK using a delay locked loop (DLL) such that a memory controller may estimate an arrival time for the output data at the memory controller (e.g., receiver 13, transmitter 11, etc.). The conventional DDR synchronous DRAM may thereby reduce a number of clock cycles to output a delay variation tDQSCK by using the DLL in the read operation. However, the DLL may increase a power consumption of the conventional system 100.

SUMMARY OF THE INVENTION

An example embodiment of the present invention is directed to a memory system, including a memory controller controlling at least one memory device, a data bus line connected between the at least one memory device and the memory controller for transferring data and a data strobe bus line connected between the at least one memory device and the memory controller to transfer at least one data strobe signal, the at least one memory device first transitioning the at least one data strobe signal to a valid logic level during a standby state, the valid logic level being less than half of a power supply voltage.

Another example embodiment of the present invention is directed to a memory device, including a memory cell array, a data output buffer buffering data read from the memory cell array and outputting the buffered data to a data bus line and a data strobe output buffer buffering at least one data strobe signal and outputting the buffered data strobe signal to a data strobe bus line, the data strobe output buffer first transitioning the at least one data strobe signal to a valid logic level during a standby state, the valid logic level being less than half of a power supply voltage.

Another example embodiment of the present invention is directed to a method of controlling a memory device, including first transitioning a data strobe signal to a valid logic level after a first period of time following an input command, the valid logic level being less than half of a power supply voltage.

Another example embodiment of the present invention is directed to a memory controller, including a data input buffer receiving data from at least one memory device through a data bus line and buffering the received data, a data strobe input buffer receiving a first data strobe signal of the at least one data strobe signal from a first memory device of the at least one memory through the data strobe bus line and buffering the first data strobe signal, a clock buffer receiving and buffering a clock signal, a control signal generator receiving an output signal of the data strobe input buffer to generate a latch clock signal, a plurality of odd bit enable signals and a plurality of even bit enable signals, a clock generator receiving the buffered clock signal from the clock buffer to generate first and second internal clock signals, a plurality of odd bit latch circuits, each of the plurality of odd bit latch circuits receiving and latching corresponding odd bits of the received data from the data input buffer in response to corresponding odd bit enable signals and the latch clock signal, a plurality of even bit latch circuits, each of the plurality of even bit latch circuits receiving and latching corresponding even bits of the received data from the data input buffer in response to corresponding even bit enable signals and the latch clock signal and a switching unit transmitting the odd bits latched by the odd bit latch circuits and the even bits latched by the even bit latch circuits in response to the first and second internal clock signals.

BRIEF DESCRIPTION OF THE DRAWINGS

The accompanying drawings are included to provide a further understanding of example embodiments of the invention, and are incorporated in and constitute a part of this specification. The drawings illustrate example embodiments of the present invention and, together with the description, serve to explain principles of example embodiments of the present invention.

FIGS. 5A-5C are timing diagrams illustrating responses of the memory systems of FIGS. 3 and 4 according to another example embodiment of the present invention.

DETAILED DESCRIPTION OF EXAMPLE EMBODIMENTS OF THE PRESENT INVENTION

Figure 1:
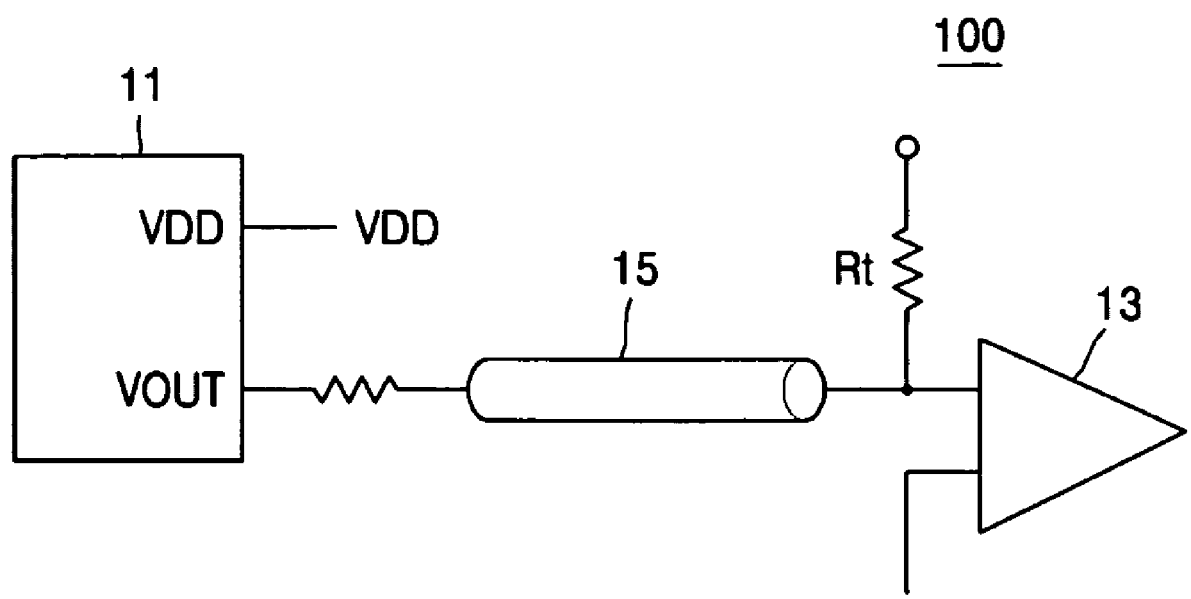
FIG. 1 is a block diagram illustrating a conventional memory system 100 with a center tap termination (CTT).
Figure 2A:
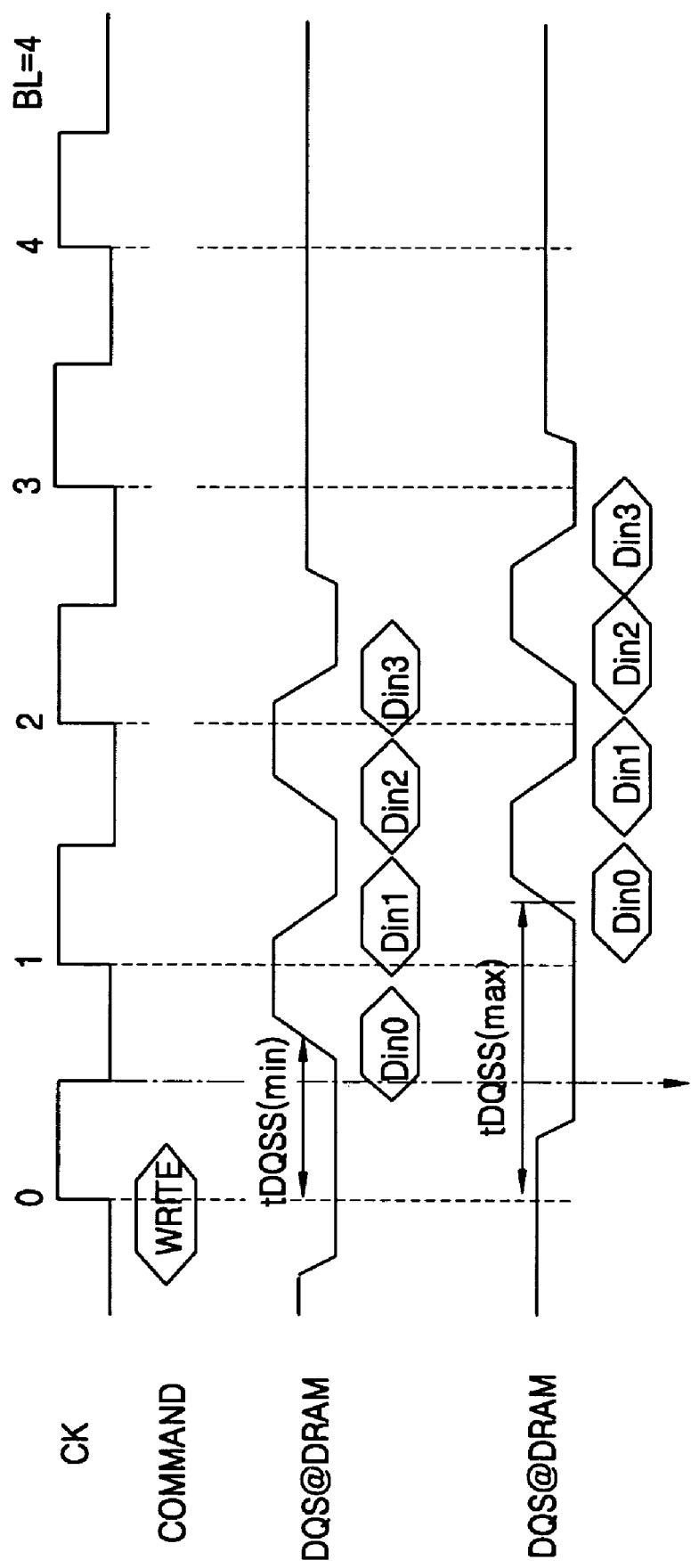
FIG. 2A is a timing diagram illustrating a conventional dual data rate (DDR) synchronous dynamic random access memory (DRAM) during a write operation.
Figure 2B:
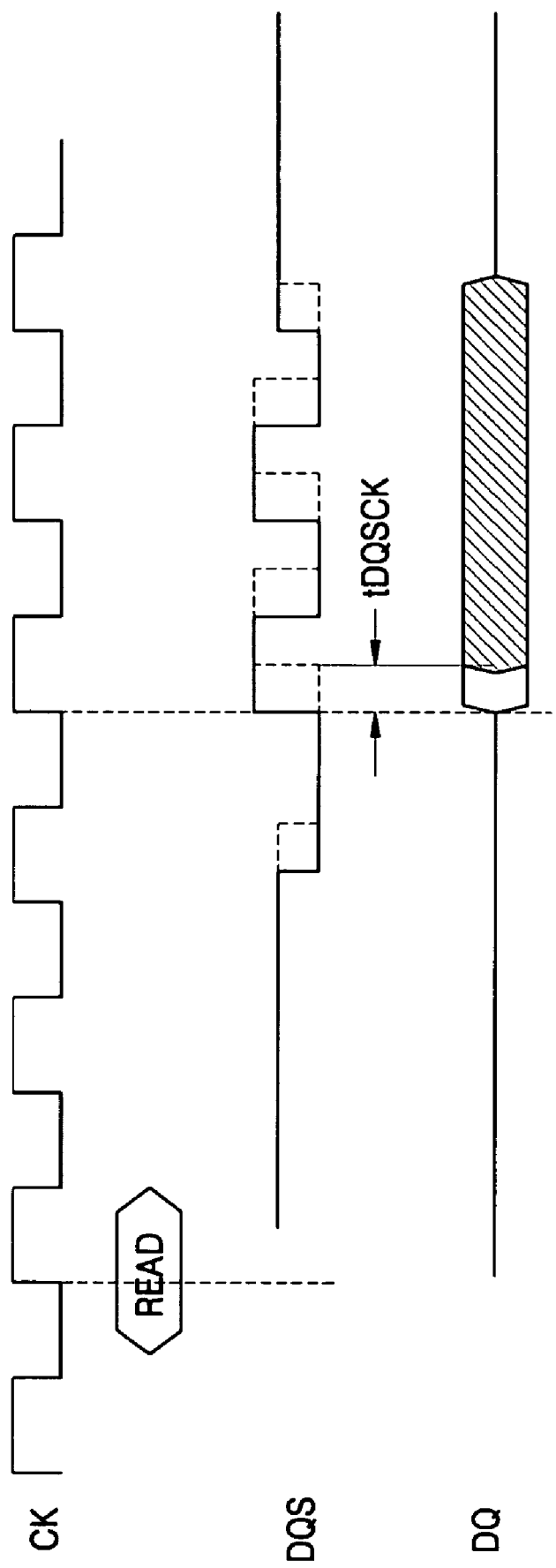
FIG. 2B is a timing diagram illustrating the conventional DDR synchronous DRAM of FIG. 2A during a read operation.

Hereinafter, example embodiments of the present invention will be described in detail with reference to the accompanying drawings.

In the Figures, the same reference numerals are used to denote the same elements throughout the drawings.

Figure 3:
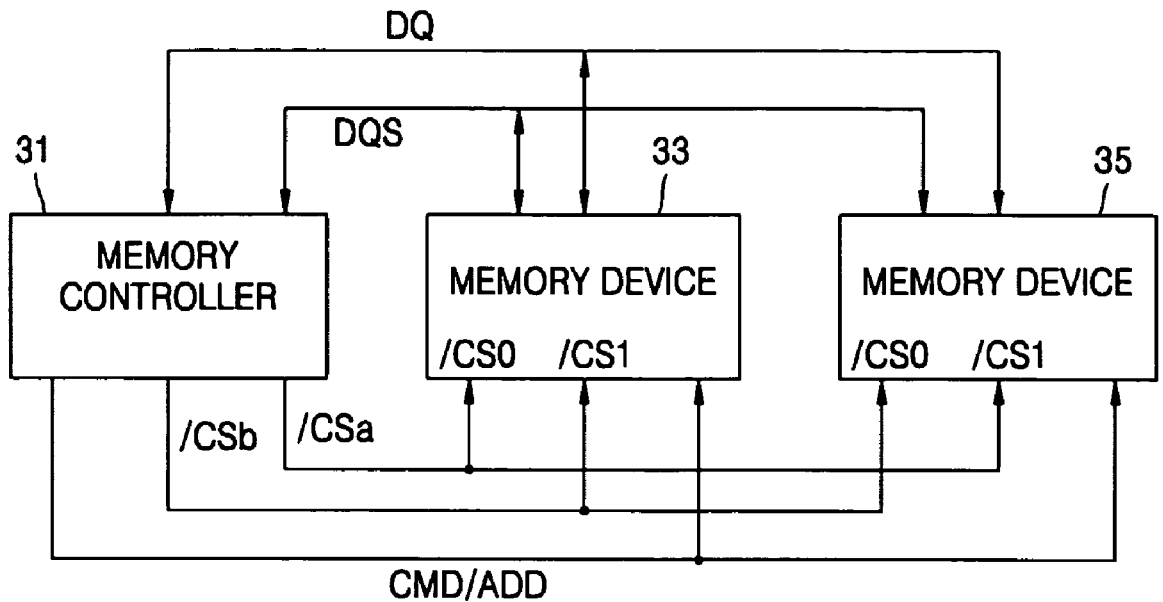
FIG. 3 is a block diagram illustrating a memory system according to an example embodiment of the present invention.

FIG. 3 is a block diagram illustrating a memory system 300 according to an example embodiment of the present invention. In an example, the memory system 300 of FIG. 3 may be a point to two point system.

In the example embodiment of FIG. 3, the memory system 300 may include memory devices 33 and 35, a memory controller 31 controlling the memory devices 33 and 35, a data bus line DQ, a data strobe bus line DQS, a first chip select signal bus line /CSa, a second chip select signal bus line /CSb and a command/address bus line CMD/ADD. In an example, the data bus line DQ and the data strobe bus line DQS may be bidirectional signal lines connected between the memory devices 33 and 35 and the memory controller 31. In a further example, the first chip select signal bus line /CSa, the second chip select signal bus line /CSb and the command/address bus line CMD/ADD may be unidirectional signal lines connected between the memory devices 33 and 35. In a further example, the memory controller 31 and the memory devices 33 and 35 may be synchronous memory devices.

In the example embodiment of FIG. 3, each of the memory devices 33 and 35 may output a data strobe signal to the data bus line DQ and to the data strobe bus line DQS. The memory devices 33 and 35 may transition the data strobe signal to a second logic level (e.g., a lower logic level).

In the example embodiment of FIG. 3, a data strobe output driver (not shown) for each of the memory devices 33 and 35 may not transition the data strobe signal DQS to a higher impedance state during an active standby period after data is output (e.g., in response to a read operation). Rather, the data strobe output driver for each of the memory devices 33 and 35 may transition the data strobe signal DQS to the second logic level (e.g., a lower logic level) until the data strobe output driver determines to set the data strobe signal DQS to the higher impedance state.

In the example embodiment of FIG. 3, each of the memory device 33 and 35 may determine when the data strobe signal DQS may be set to the higher impedance state. For example, the memory controller 31 (alternatively referred to as point "A") may correspond to a master and each of the memory device 33 (alternatively referred to as point "B") and the memory device 35 (alternatively referred to as point "C") may correspond to slaves. The data strobe signal DQS may be determined at each of points A, B and C. A command bus line CMD may be used to determine a status of the data strobe signal DQS at points A, B and C.

In the embodiment of FIG. 3, point A may have knowledge of all of the command states throughout the memory system 300 because point A may function as the master. As discussed above, an arrival time of the data strobe signal DQS, for example which may arrive at the point A from one of the point B and C, may be difficult to estimate using conventional methods and systems when data is read (e.g., output) from the point B or C. In another example embodiment of the present invention, if the points B and/or C (e.g., which may correspond to memory devices) have knowledge of the command states, the points B and/or C may estimate the arrival time of the data strobe signal DQS with greater accuracy which may thereby increase an efficiency of the data strobe signal bus line. Accordingly, in an example, the memory devices 33 and 35 may be configured to as to access information regarding the command states on the command bus line CMD.

In the example embodiment of FIG. 3, the memory devices 33 and 35 may each include a first chip select pin /CS0 coupled to a first chip select signal bus line /CSa and a second chip select pin /CS1 coupled to a second chip select signal bus line /CSb. The first chip select pin /CS0 may be used for general memory operations for each of the memory devices 33 and 35 and the second chip select pin /CS1 may be used for "snooping" (e.g., detecting, monitoring, etc.) commands transferred to the other memory device (e.g., where the "other" memory device may be the memory device 33 from the perspective of the memory device 35, etc.). Thus, each of the memory devices 33 and 35 may detect signals received by the second select pin /CS1 to determine whether a command is input to the other memory device and may control the data strobe output driver in response based on a result of the detection.

In the example embodiment of FIG. 3, if a signal received at the first chip select pin /CS0 transitions to the second logic level (e.g., a lower logic level) and a signal input to the second chip select pin /CS1 transitions to a first logic level (e.g., a higher logic level), a command input through the command bus line CMD may be interpreted as a command given to the corresponding memory device (e.g., memory device 33, memory device 35, etc.) (e.g., the memory device performing the detection). Alternatively, when the signal input to the first chip select pin /CS0 transitions to the first logic level (e.g., a higher logic level) and the signal input to the second chip select pin /CS1 transitions to the second logic level (e.g., a lower logic level), the command input through the command bus line CMD may be interpreted as a command given to the other memory device (e.g., the memory device not performing the detection). The above described example embodiments of the present invention will be described in greater detail later with respect to FIGS. 6 and 7.

An example operation of the memory system 300 of FIG. 3 will now be described.

In the example operation of the memory system 300 of FIG. 3, the memory controller 31 may transition the first chip select signal /CSa to the second logic level (e.g., a lower logic level) and the second chip select signal /CSb to the first logic level (e.g., a higher logic level) and a first read command RD may be delivered to one of the memory devices 33 and 35 through the command bus line CMD. The first memory device 33 may interpret the first read command RD as being directed to the first memory device 33. The first memory device 33 may transition the data strobe signal DQS to the second logic level (e.g., a lower logic level) a number of clock cycles (e.g., one clock cycle) after the first read command RD is received. The first memory device 33 may also transition the data strobe signal DQS to the second logic level after data is output (e.g., in response to the first read command RD).

In the example operation of the memory system 300 of FIG. 3, a second read command RD may be input to the first memory device 33 after the first read command RD may be input to the first memory device 33. The first memory device 33 may transition the data strobe signal DQS to the second logic level (e.g., a lower logic level). The first memory device 33 may toggle the data strobe signal by a burst length (e.g., of the response to the second read command RD) after a CAS latency. The first memory device may transition the data strobe signal DQS to the second logic level after the toggling. A timing diagram illustrating the above-described example scenario will be discussed in greater detail below with reference to FIG. 5A.

In the example operation of the memory system 300 of FIG. 3, when the second read command RD is input to the second memory device 35 after the values of the first and second chip select signals /CSa and /CSb are controlled such that the second read command RD is input to the first memory device 33, the first memory device 33 may detect the second read command RD input to the second memory device 35 and may transition the data strobe signal DQS from the second logic level (e.g., a lower logic level) to the higher impedance state at a next clock signal edge. The data strobe output driver (not shown) of the first memory device 33 may be turned off. The second memory device 35 may turn on the data strobe signal output driver when the data strobe signal output driver of the first memory device 33 may be turned off to transition the data strobe signal DQS to the second logic level and may toggle the data strobe signal by the burst length. The second memory device 35 may transition the data strobe signal back to the second logic level after the toggling.

In the example operation of the memory system 300 of FIG. 3, a write command WR may be input to one of the first memory device 33 and the second memory device 35 after the first read command RD is input to the first memory device 33. The first memory device 33 may transition the data strobe signal DQS to the higher impedance at a clock signal edge (e.g., a rising edge, a falling edge, etc.) following the write command WR. The memory controller 31 may maintain the data strobe signal bus line at the second logic level. A timing diagram illustrating the above-described example scenario will be discussed in greater detail below with reference to FIG. 5B. In an example, a second write command WR following the write command WR may function similarly as compared to the write command WR.

In the example operation of the memory system 300 of FIG. 3, a read command RD may be input to the first memory device 33 after a write command WR may be input to the first memory device 33. The memory device 33 may transition the data strobe signal DQS to the second logic level (e.g., a lower logic level) at a clock signal edge (e.g., a rising edge, a falling edge, etc.) following the read command RD and may toggle the data strobe signal DQS by the burst length (e.g., the length of time for data to be output in response to the read command RD). The memory device 33 may transition to data strobe signal DQS back to the second logic level after the toggling.

In the example operation of the memory system 300 of FIG. 3, a read command RD may be input to the memory device 35 after a write command WR is input to the memory device 33. The memory device 33 may detect the read command RD and may transition the data strobe signal DQS to the second logic level (e.g., a lower logic level) at a next clock signal edge (e.g., a rising edge, a falling edge, etc.). The memory device 33 may toggle the data strobe signal by the burst length and may transition the data strobe signal back to the second logic level (e.g., a lower logic level) after the toggling.

In the example operation of the memory system 300 of FIG. 3, before a command response (e.g., to a read command, to a write command, etc.), the first and second memory devices 33 and 35 may be in a pre-charge standby state. In the pre-charge standby state, the first and second memory devices 33 and 35 may transition their respective data strobe signals to the higher impedance state in order to reduce power consumption. The data strobe output drivers of the first and second memory devices 33 and 35 may thereby be turned off. The pre-charge standby state may indicate that word-lines connected to memory cells in the memory devices 33 and 35 may be disabled.

While the above-describe example embodiment of FIG. 3 may illustrate an example of a memory system with a point (e.g., point A, the memory controller 31, etc.) connected to two points (e.g., points B and C, the memory devices 33 and 35, etc.), other example embodiments of the present invention may employ other ratios with respect of point to point connections. For example, a point to point connection may be established (e.g., as opposed to a point to two point connection). An example embodiment of the point to point connection will be described in greater detail below with respect to FIG. 4.

Furthermore, the example embodiment shown in FIG. 3 may illustrate an example embodiment of the present invention as applied to a memory device in a memory system. However, other example embodiments of the present invention may be implemented at a memory controller (e.g., the memory controller 31).

Figure 4:
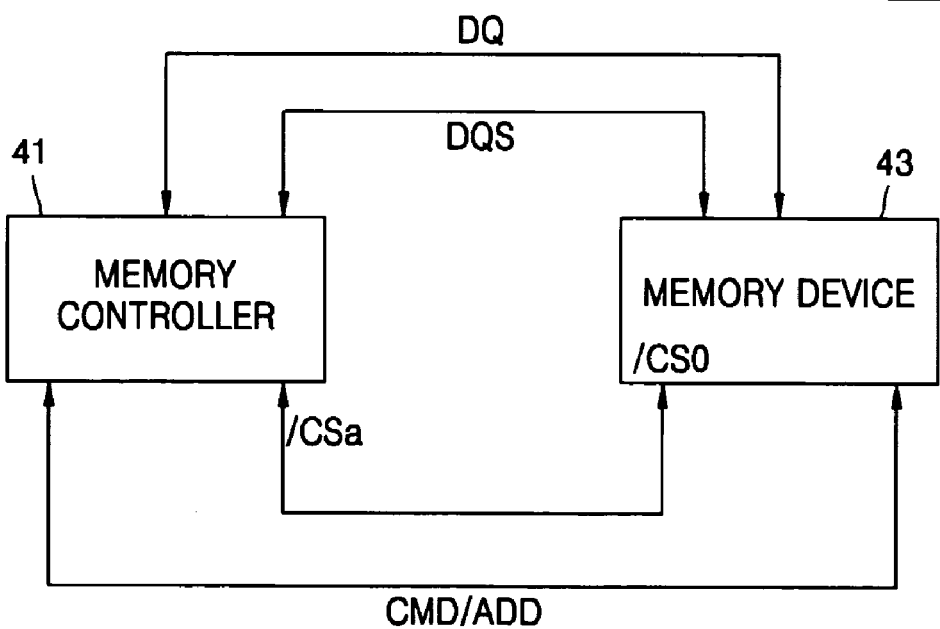
FIG. 4 is a block diagram illustrating another memory system according to an example embodiment of the present invention.

FIG. 4 is a block diagram of a memory system 400 according to another example embodiment of the present invention. The memory system 400 may include a point to point connection.

In the example embodiment of FIG. 4, the memory system 400 may include a memory device 43, a memory controller 41 for controlling the memory device 43, a data bus line DQ, a data strobe bus line DQS, a chip select signal bus line /CSa and a command/address bus line CMD/ADD.

In the example embodiment of FIG. 4, the memory system 400 may include a single memory device (e.g., the memory device 43) and a single chip select signal bus line (e.g., the chip select signal bus line /CSa). The memory device 43 may include a single chip select pin (e.g., the chip select pin /CS0) in contrast to the memory devices 33 and 35 of FIG. 3, which may include two chip select pins. The power supply voltage VDD may be applied to the second chip select pin /CS1 at the first logic level (e.g., a higher logic level) (e.g., to inactivate the signal) if the memory controller 31 of FIG. 3 replaces the memory controller 41 of FIG. 4 because the second chip select pin /CS1 may be included in the memory controller 31 but need not be employed in the memory system 400 of FIG. 4.

In the example embodiment of FIG. 4, the memory device 43 may output a data strobe signal, which may strobe data to the data bus line DQ, to the data strobe bus line DQS. The memory device 43 need not drive the data strobe signal DQS to the higher impedance state following a toggling edge (e.g., a rising edge, a falling edge, etc.) of the data strobe signal DQS. Rather, the memory device 43 may transition the data strobe signal to the second logic level (e.g., a lower logic level) following a burst length of a read operation. Thus, a data strobe output driver in the memory device 43 need not transition the data strobe signal DQS to the higher impedance state after data corresponding to a burst length may be output but rather may transition the data strobe signal to the second logic level (e.g., a lower logic level) until the memory device 43 determines to transition the data strobe signal DQS to the higher impedance state.

An example operation of the memory system 400 of FIG. 4 will now be described.

In the example operation of the memory system 400 of FIG. 4, the chip select signal /CSa may be set to the second logic level (e.g., a lower logic level) and a read command RD may be delivered through the command bus line CMD. The memory device 43 may receive the read command RD and may transition the data strobe signal DQS to the second logic level at a next clock cycle. The memory device 43 may toggle the data strobe signal by the burst length of a response to the read command RD. The memory device 43 may transition the data strobe signal back to the second logic level after the toggling.

In the example operation of the memory system 400 of FIG. 4, two consecutive read commands RD may be input to the memory device 43. After a second of the two consecutive read commands RD is delivered, the memory device 43 may transition the data strobe signal DQS to the second logic level. The memory device 43 may toggle the data strobe signal by the burst length after a CAS latency in response to the second read command RD. The memory device 43 may transition the data strobe signal back to the second logic level after the toggling. A timing diagram illustrating the above-described example scenario will be discussed in greater detail below with reference to FIG. 5A.

In the example operation of the memory system 400 of FIG. 4, the chip select signal /CSa may be set to the second logic level (e.g., a lower logic level) and a read command RD may be input to the memory device 43 followed by a write command WR. The memory device 43 may transition the data strobe signal DQS to the higher impedance state at a clock signal edge (e.g., a falling edge, a rising edge, etc.) following the write command WR. In another example, in the above-described scenario where a write command follows a read command, the memory controller 41 may maintain the data strobe signal DQS at the second logic level such that the data strobe bus line may be maintained at the second logic level. A timing diagram illustrating the above-described example scenario will be discussed in greater detail below with reference to FIG. 5B.

In the example operation of the memory system 400 of FIG. 4, the chip select signal /CSa may be set to the second logic level (e.g., a lower logic level) and a write command WR may be input to the memory device 43 followed by a read command RD. The memory device 43 may transition the data strobe signal DQS to the second logic level a clock cycle after the read command RD. The memory device 43 may toggle the data strobe signal by the burst length. The memory device 43 may transition the data strobe signal DQS back to the second logic level after the toggling. A timing diagram illustrating the above-described example scenario will be discussed in greater detail below with reference to FIG. 5C.

In the example operation of the memory system 400 of FIG. 4, the memory device 43 may transition the data strobe signal to the higher impedance state at a pre-charge standby state. Thus, the data strobe output driver in the memory device 43 may be turned off in the pre-charge standby state.

FIGS. 5A-5C are timing diagrams illustrating responses of the memory systems 300 and 400 of FIGS. 3 and 4, respectively, according to another example embodiment of the present invention. In the example embodiments of FIGS. 5A-5C, a burst length BL may be 4 and a CAS latency CL may be 3. FIG. 5A may be representative of the above-describe condition (e.g., with respect to either the memory system 300 of FIG. 3 or the memory system 400 of FIG. 4) where two consecutive read commands may be received by at least one memory device of the memory systems 300/400. FIG. 5B may be representative of the above-describe condition (e.g., with respect to either the memory system 300 of FIG. 3 or the memory system 400 of FIG. 4) where a read command followed by a write command may be received by at least one memory device of the memory systems 300/400. FIG. 5C may be representative of the above-describe condition (e.g., with respect to either the memory system 300 of FIG. 3 or the memory system 400 of FIG. 4) where two consecutive write commands may be received by at least one memory device of the memory systems 300/400.

Figure 6:
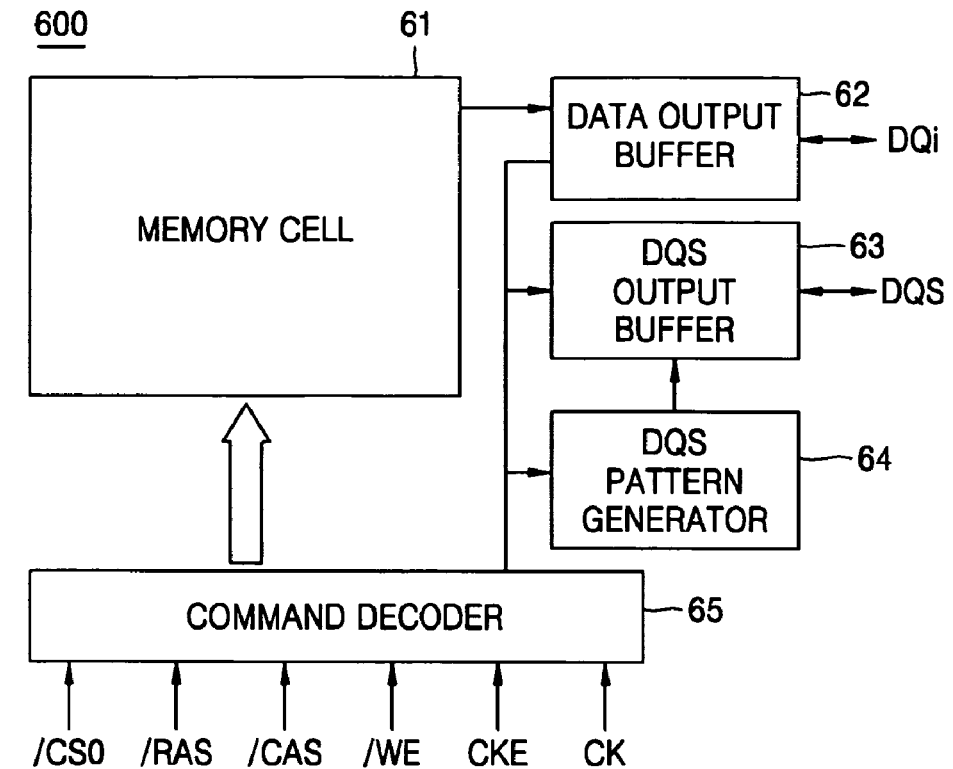
FIG. 6 is a block diagram illustrating a memory device according to another example embodiment of the present invention.

FIG. 6 is a block diagram illustrating a memory device 600 according to another example embodiment of the present invention. In an example, the memory device 600 may be an example of the memory device 43 of FIG. 4.

In the example embodiment of FIG. 6, the memory device 600 may include a memory cell 61, a data output buffer 62 outputting data read from the memory cell array 61, a data strobe output buffer 63 outputting a data strobe signal DQS, a data strobe signal pattern generator 64 generating a pattern of the data strobe signal DQS and a command decoder 65. The memory device 600 may further include a chip select pin /CS0, command input pins /RAS, /CAS and /WE, a clock enable pin /CS0 and a clock input pin CK.

In the example embodiment of FIG. 6, the command decoder 65 may receive a command through the command input pins /RAS, /CAS and /WE. The command decoder 65 may decode the command. The data output buffer 62, the data strobe output buffer 63 and the DQS pattern generator 64 may be controlled in response to the decoded command if a signal input to the chip select pin /CS0 is set to the second logic level (e.g., a lower logic level). For example, when the signal input to the chip select pin /CS0 is set to the second logic level and a read command RD is input through the command input pins /RAS, /CAS and /WE, the command decoder 65 may enable (e.g., transition to the first logic level) the data strobe output buffer 63 at the clock cycle following the read command RD to transition the data strobe signal DQS to the second logic level. The DQS pattern generator 64 may output a data pattern toggled in response to the burst length of the read command to the data strobe output buffer 63. The data strobe output buffer 63 may output a data strobe signal DQS corresponding to the toggling pattern. The data strobe output buffer 63 need not transition the data strobe signal to the higher impedance after the toggling but rather may transition the data strobe signal DQS to the second logic level after a last edge of the toggling.

In the example embodiment of FIG. 6, if two consecutive read commands RD are received by the memory device 643, the command decoder 65 may control the data strobe output buffer 63 to transition the data strobe signal DQS to the second logic level (e.g., a lower logic level). The DQS pattern generator 64 may output a toggling pattern in response to the burst length of the later of the two read commands to the data strobe output buffer 64. The data strobe output buffer 63 may output a data strobe signal DQS corresponding to the toggling pattern. The data strobe output buffer 63 need not transition the data strobe signal to the higher impedance after the toggling but rather may transition the data strobe signal to the second logic level (e.g., a lower logic level).

In the example embodiment of FIG. 6, when a signal input to the chip select pin /CS0 is set to the second logic level (e.g., a lower logic level) and a read command RD is followed by a write command WR, the command decoder 65 may control the data strobe output buffer 63 to transition the data strobe signal DQS to the higher impedance state at the clock signal edge following the write command WR. The data strobe output buffer 63 may thereby be turned off.

In the example embodiment of FIG. 6, when a signal input to the chip select pin /CS0 is set to the second logic level (e.g., a lower logic level) and a write command WR is followed by a read command RD, the command decoder 65 may control the data strobe output buffer 63 to transition the data strobe signal DQS to the second logic level (e.g., a lower logic level) at a clock cycle following the read command RD.

In the example embodiment of FIG. 6, in a pre-charge standby state, the command decoder 65 may control the data strobe output buffer 63 to transition the data strobe signal DQS to the higher impedance state.

Figure 7:
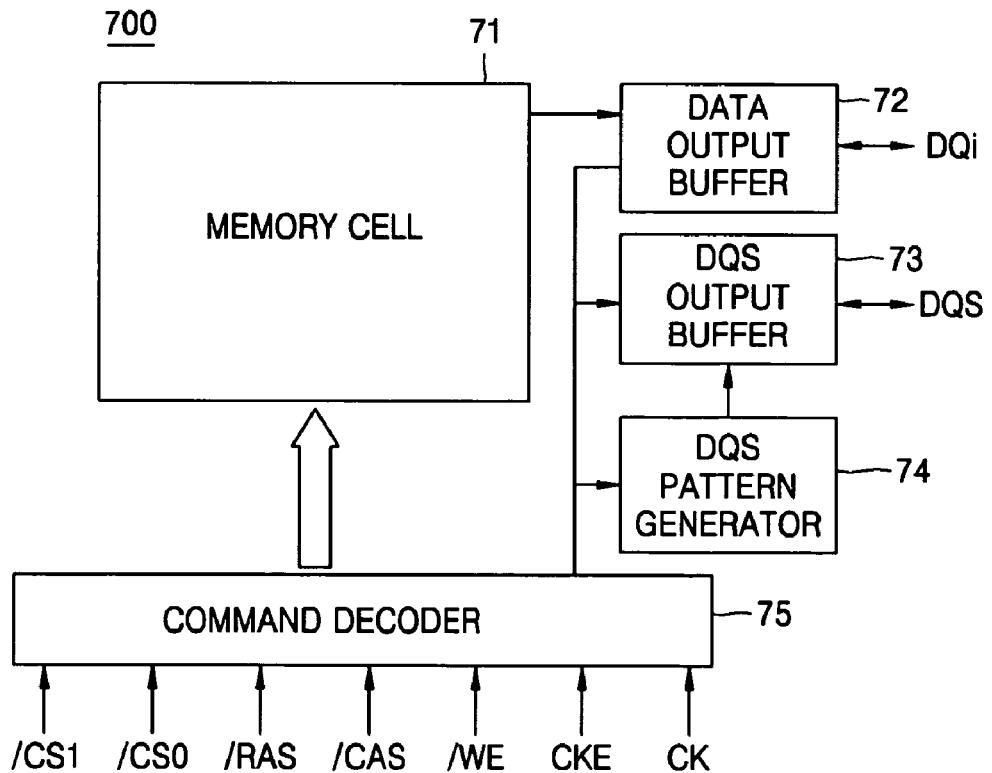
FIG. 7 is a block diagram illustrating another memory device according to another example embodiment of the present invention.

FIG. 7 is a block diagram illustrating a memory device 700 according to another example embodiment of the present invention. In an example, the memory device 700 may be an example of at least one of the memory device 33 and the memory device 35 of FIG. 4.

In the example embodiment of FIG. 7, the memory device 700 may include a memory cell 71, a data output buffer 72 buffering and outputting data read from the memory cell array 71, a data strobe output buffer 73 buffering and outputting a data strobe signal DQS, a data strobe signal pattern generator 74 generating a pattern of the data strobe signal DQS and a command decoder 75. The memory device 700 may further include a first chip select pin /CS0, a second chip select pin /CS1, command input pins /RAS, /CAS and /WE, a clock enable pin /CS0 and a clock input pin CK.

In the example embodiment of FIG. 7, the command decoder 75 may interpret a command on the command input pins /RAS, /CAS and /WE as a command intended for execution by the memory device 700 and may receive the command when a signal input to the first chip select pin /CS0 is set to the second logic level (e.g., a lower logic level) and a signal input to the second chip select pin /CS1 is set to the first logic level (e.g., a higher logic level). The command decoder 75 may decode the received command and may control the data output buffer 72, the data strobe output buffer 73 and the DQS pattern generator 74 based on the decoded command.

In the example embodiment of FIG. 7, when the signal input to the first chip select pin /CS0 is set to the first logic level (e.g., a higher logic level) and the signal input to the second chip select pin /CS1 is set to the second logic level (e.g., a lower logic level), the command decoder 75 may interpret a command input through the command input pins /RAS, /CAS and /WE as designated for a memory device other than the memory device 700 (e.g., the memory device 33 if the memory device 700 may be representative of the memory device 35, etc.) and as such may not receive the command.

In the example embodiment of FIG. 7, when a signal input to the first chip select pin /CS0 is set to the second logic level (e.g., a lower logic level), a signal input to the second chip select pin /CS1 is set to the first logic level (e.g., a higher logic level) and a read command RD is input through the command input pins /RAS, /CAS and /WE, the command decoder 75 may control the data strobe output buffer 73 to transition the data strobe signal DQS to the second logic level (e.g., a lower logic level) at a clock cycle following the read command RD. The DQS pattern generator 74 may output a toggling pattern corresponding to the burst length of the read command RD to the data strobe output buffer 73. The data strobe output buffer 73 may output a data strobe signal corresponding to the toggling pattern. The data strobe output buffer 73 may transition the data strobe signal to the second logic level (e.g., a lower logic level) after the toggling of the data strobe signal (e.g., after read data may be output during the burst length).

In the example embodiment of FIG. 7, if two consecutive read commands RD are provided to the memory device 700, the command decoder 75 may control the data strobe output buffer 73 to transition the data strobe signal to the second logic level (e.g., a lower logic level).

In the example embodiment of FIG. 7, if a first read command RD is input through the command input pins /RAS, /CAS and /WE and a signal input to the first chip select pin /CS0 is set to the first logic level (e.g., a higher logic level) and a signal input to the second chip select pin /CS1 is set to the second logic level (e.g., a lower logic level) such that a second read command RD is input to another memory device (e.g., other than the memory device 700), the command decoder 75 may detect the second read command RD and may control the data strobe output buffer 73 to transition the data strobe signal DQS to the higher impedance state at a clock signal edge following the second read command RD.

In the example embodiment of FIG. 7, if a read command RD is followed by a write command WR, the command decoder 75 may control the data strobe output buffer 73 to transition the data strobe signal DQS to the higher impedance state at a clock signal edge (e.g., a rising edge, a falling edge, etc.) following the write command WR.

In the example embodiment of FIG. 7, if a read command RD is input through the command input pins /RAS, /CAS and /WE, a signal input to the first chip select pin /CS0 is set to the first logic level (e.g., a higher logic level) and a signal input to the second chip select pin /CS1 is set to the second logic level (e.g., a lower logic level) such that a write command WR is input to another memory device (e.g., other than the memory device 700), the command decoder 75 may detect the write command WR and may control the data strobe output buffer 73 to transition the data strobe signal DQS to the higher impedance state at a clock signal edge (e.g., a rising edge, a falling edge, etc.) following the write command WR.

In the example embodiment of FIG. 7, if a write command WR is followed by a read command RD, the command decoder 75 may control the data strobe output buffer 73 to transition the data strobe signal DQS to the second logic level (e.g., a lower logic level) following the read command RD (e.g., a clock cycle after the read command RD, immediately after the read command RD, etc.).

In the example embodiment of FIG. 7, if a write command WR is input through the command input pins /RAS, /CAS and /WE, a signal input to the first chip select pin /CS0 is set to the first logic level (e.g., a higher logic level) and a signal input to the second chip select pin /CS1 is set to the second logic level (e.g., a lower logic level) such that a read command RD is input to another memory device (e.g., other than the memory device 700), the command decoder 75 may detect the read command RD and may control the data strobe output buffer 73 to transition the data strobe signal DQS to the higher impedance state at a clock signal edge (e.g., a rising edge, a falling edge, etc.) following the read command RD.

In the example embodiment of FIG. 7, if a write command WR is followed by a read command RD, the command decoder 75 may control the data strobe output buffer 73 to transition the data strobe signal DQS to the higher impedance state after the write command WR (e.g., at a next clock cycle after the write command WR).

In the example embodiment of FIG. 7, if a first write command WR is input through the command input pins /RAS, /CAS and /WE, a signal input to the first chip select pin /CS0 is set to the first logic level (e.g., a higher logic level) and a signal input to the second chip select pin /CS1 is set to the second logic level (e.g., a lower logic level) such that a second write command WR is input to another memory device, the command decoder 75 may detect the second write command WR and may control the data strobe output buffer 73 to transition the data strobe signal DQS to the higher impedance state at a clock signal edge (e.g., a rising edge, a falling edge, etc.) following the second write command.

In another example embodiment of the present invention, the memory devices 600 and 700 illustrated in FIGS. 6 and 7, respectively, may include a delay locked loop (DLL) circuit (not shown) to synchronize the output data DQ with the clock signal CK. If the memory devices 600 and 700 synchronize the output data DQ with the clock signal CK and output the synchronized output data DQ, a memory controller (e.g., the memory controller 31 of FIG. 3, the memory controller 41 of FIG. 4, etc.) may estimate an arrival time for the synchronized output data at the memory controller with an increased accuracy and/or stability. In an alternative example embodiment of the present invention, the memory devices 600 and 700 may not include the DLL circuit. In an example where the memory devices 600 and 700 may not include the DLL circuit, a preamble period may be increased and/or the data strobe signal may be maintained at the second logic level (e.g., a lower logic level) continuously such that a receiver configured to operate with the memory controller may recognize a valid data strobe toggle.

Figure 8:
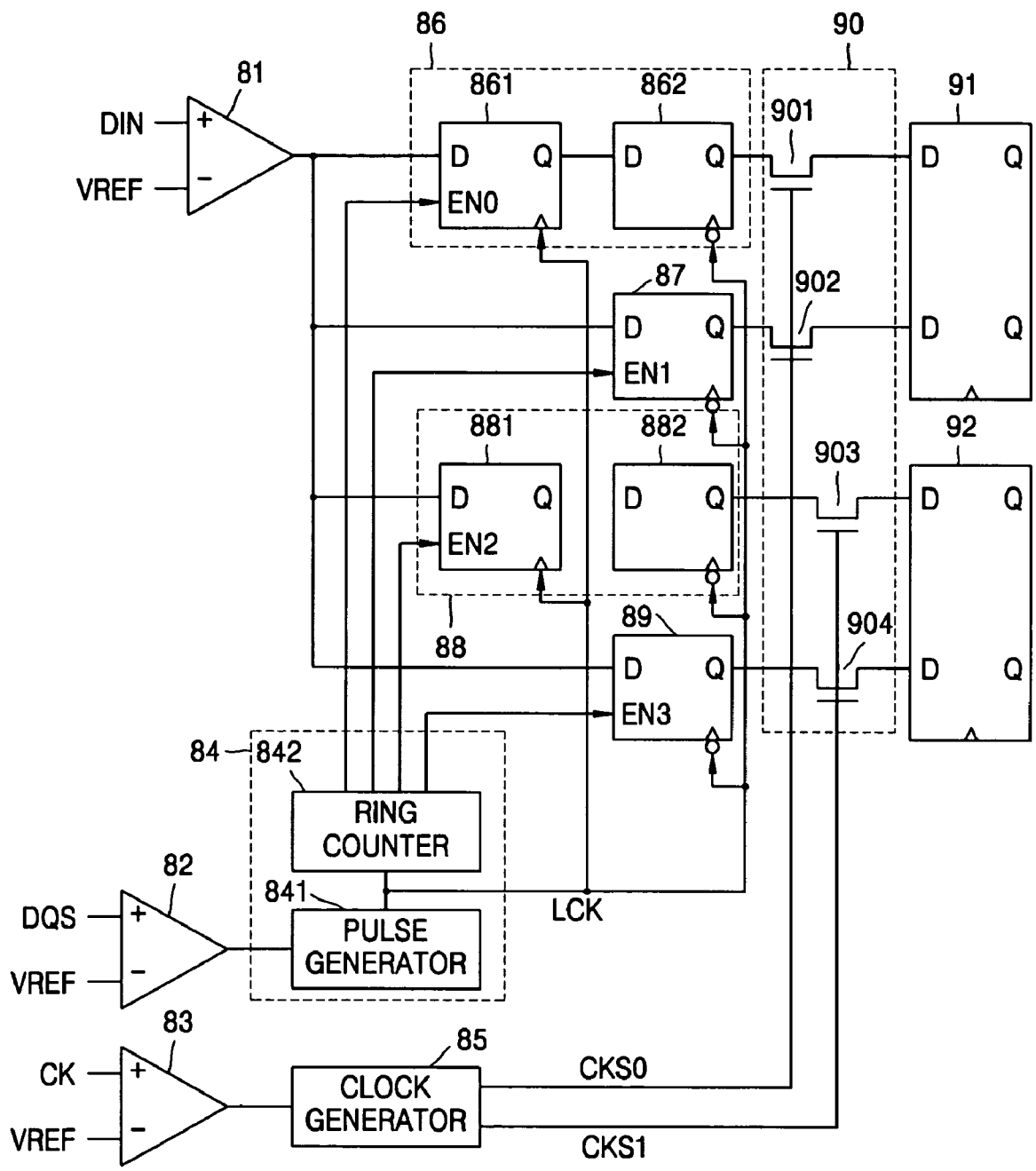
FIG. 8 is a block diagram illustrating a memory controller according to another embodiment of the present invention.

FIG. 8 is a block diagram illustrating a memory controller 800 according to another embodiment of the present invention. In an example, the memory controller 800 may be configured to communicate (e.g., receive read data) with a memory device (not shown) (e.g., memory device 33, 35, 43, 600, 700, etc.) not including the DLL circuit.

In the example embodiment of FIG. 8, the memory controller 800 may include a data input buffer 81, a data strobe input buffer 82, a clock buffer 83, a control signal generator 84, a clock generator 85, a plurality of odd bit data latch circuits 86 and 88, a plurality of even bit data latch circuits 87 and 89, a switching unit 90 and internal data latch circuits 91 and 92.

In the example embodiment of FIG. 8, the data input buffer 81 may receive and buffer data DIN based on a reference voltage VREF. The data strobe input buffer 82 may receive and buffer the data strobe signal DQS, which may strobe the data DIN, based on the reference voltage VREF. The clock buffer 83 may receive and buffer the clock signal CK based on the reference voltage VREF.

In the example embodiment of FIG. 8, the control signal generator 84 may include a pulse generator 841 receiving an output signal of the data strobe input buffer 82 and a ring counter 842 responsive to an output signal of the pulse generator 841. The pulse generator 841 may generate a latch clock signal LCK which may match the output signal of the data strobe input buffer 82. The ring counter 842 may count transitions (e.g., between the first logic level and the second logic level) of the latch clock signal LCK to generate signals EN0, EN1, EN2 and EN3 which may enable the latch circuits 86, 87, 88 and 89. The ring counter 842 may generate a plurality of odd bit enable signals EN0 and EN2 responsive to first edges (e.g., rising edges, falling edges, etc.) of the latch clock signal LCK and a plurality of even bit enable signals EN1 and EN3 responsive to second edges (e.g., falling edges, rising edges, etc.) of the latch clock signal LCK.

In the example embodiment of FIG. 8, the enable signals EN0, EN1, EN2 and EN3 may be set to the first logic level (e.g., a higher logic level) to enable the latch circuits 86, 87, 88 and 89. The enable signal EN0 may be disabled after a first rising edge of the latch clock signal LCK, enabled after a second rising edge of the latch clock signal LCK and disabled again after a third rising edge of the latch clock signal LCK. The enable signal EN1 may be disabled after a first falling edge of the latch clock signal LCK, enabled after a second falling edge of the latch clock signal LCK, and disabled again after a third falling edge of the latch clock signal LCK. The enable signal EN2 may be disabled after the second rising edge of the latch clock signal LCK, enabled after the third rising edge of the latch clock signal LCK and disabled again after a fourth rising edge of the latch clock signal LCK. The enable signal EN3 may be disabled after the second falling edge of the latch clock signal LCK, enabled after the third falling edge of the latch clock signal LCK and disabled again after a fourth falling edge of the latch clock signal LCK.

In the example embodiment of FIG. 8, the clock generator 85 may receive a buffered clock signal (e.g., buffered by the clock buffer 83) to generate first and second internal clock signals CKS0 and CKS1, respectively. The first odd bit latch circuit 86 may be enabled in response to the odd bit enable signal EN0. The first odd bit latch circuit 86 may receive and latch a first data (e.g., a first odd bit) buffered by the data input buffer 81 in response to the latch clock signal LCK. The first odd bit latch circuit 86 may include a first flip-flop 861 which may be enabled by the odd bit enable signal EN0 and may latch the first data in response to an edge (e.g., a rising edge) of the latch clock signal LCK and a second flip-flop 862 which may latch an output signal of the first flip-flop 861 in response to an edge (e.g., a falling edge) of the latch clock signal LCK.

In the example embodiment of FIG. 8, the first even bit latch circuit 87 may be enabled in response to the even bit enable signal EN1. The first even bit latch circuit 87 may receive and latch a second data (e.g., a first even bit) buffered by the data input buffer 81 in response to an edge (e.g., a falling edge) of the latch lock signal LCK. In an example, the first even bit latch circuit 87 may include a flip-flop.

In the example embodiment of FIG. 8, the second odd bit latch circuit 88 may be enabled in response to the odd bit enable signal EN2. The second odd bit latch circuit 88 may receive and latch a third data (e.g., a second odd bit) buffered by the data input buffer 81 in response to the latch clock signal LCK. The second odd bit latch circuit 88 may include a first flip-flop 881 which may be enabled by the odd bit enable signal EN2 and may latch the third data (e.g., the second odd bit) in response to an edge (e.g., a rising edge) of the latch clock signal LCK. The second odd bit latch circuit 88 may further include a second flip-flop 882 that may latch an output signal of the first flip-flop 881 in response to an edge (e.g., a falling edge) of the latch clock signal LCK.

In the example embodiment of FIG. 8, the second even bit latch circuit 89 may be enabled in response to the even bit enable signal EN3. The second even bit latch circuit 89 may receive and latch a fourth data (e.g., a second even bit) buffered by the data input buffer 81 in response to an edge (e.g., a falling edge) of the latch lock signal LCK. In an example, the second even bit latch circuit 89 may include a flip-flop.

In the example embodiment of FIG. 8, the switching unit 90 may transmit odd data (e.g., odd bits) latched in the odd bit latch circuits 86 and 88 and even data (e.g., even bits) latched in the even bit latch circuits 87 and 89 to the internal data latch circuits 91 and 92 in response to the first and second internal clock signals CKS0 and CKS1. The switching unit 90 may include first, second, third and fourth switches 901, 902, 903 and 904. The first switch 901 may transmit the first data (e.g., the first odd bit) latched in the first odd bit latch circuit 86 to the internal data latch circuit 91 in response to the first internal clock signal CKS0. The second switch 902 may transmit the second data (e.g., the first even bit) latched in the first even bit latch circuit 87 to the internal data latch circuit 91 in response to the first internal clock signal CKS0. The third switch 903 may transmit the third data (e.g., the second odd bit) latched in the second odd bit latch circuit 88 to the internal data latch circuit 92 in response to the second internal clock signal CKS1. The fourth switch 904 may transmit the fourth data (e.g., the second even bit) latched in the second even bit latch circuit 89 to the internal data latch circuit 92 in response to the second internal clock signal CKS1.

In the example embodiment of FIG. 8, the internal data latch circuit 91 may latch the transmitted first data (e.g., the first odd bit) and the transmitted second data (the first even bit). Likewise, the internal data latch circuit 92 may latch the transmitted third data (e.g., the second odd bit) and the transmitted fourth data (e.g., the second even bit).

Figure 9:
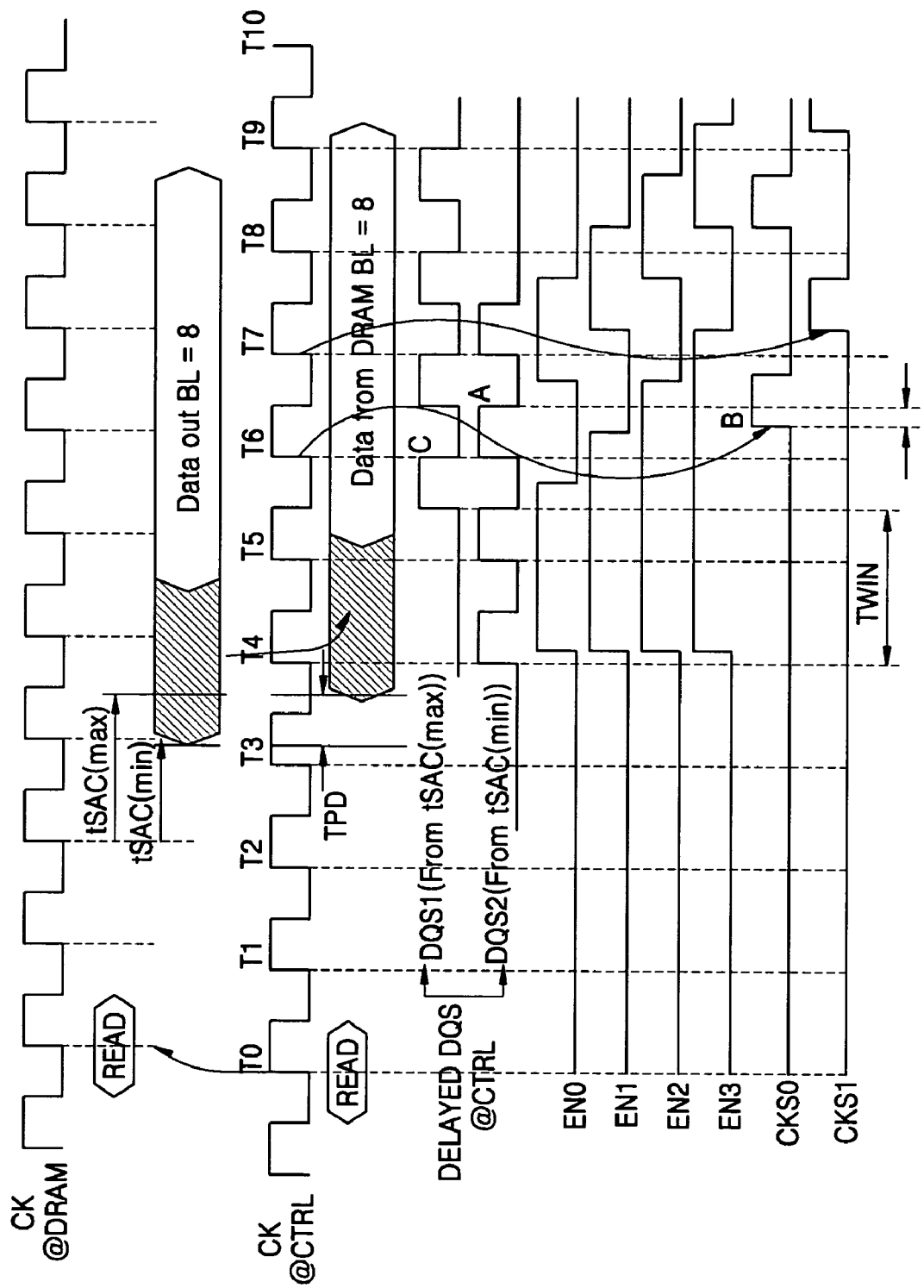
FIG. 9 illustrates a timing diagram for the memory controller of FIG. 8 according to another example embodiment of the present invention.

FIG. 9 illustrates a timing diagram for the memory controller 800 of FIG. 8 according to another example embodiment of the present invention. The timing diagram of FIG. 9 may illustrate an example where a receiver CTRL of the memory controller 800 may receive data read from a memory device (not shown) (e.g., a DRAM). In FIG. 9, it may be assumed that a CAS latency CL may be 3 clock cycles and a burst length BL may be 8 clock cycles.

In the example embodiments of FIGS. 8 and 9, a value tSAC(max) may denote a maximum clock to output delay and tSAC(min) may represent a minimum clock to output delay. An interval TWIN may indicate a tSAC variation interval (e.g., a difference between the value tSAC(max) and the value tSAC(min)). A propagation time TPD may denote a propagation time during which data may be transmitted from a memory device (e.g., memory device 33, 35, 43, 600, 700, etc.) to the memory controller 800. DQS1 may denote a delayed data strobe signal DQS output from the memory device and received at the memory controller 800 at tSAC (max). DQS2 may denote the delayed data strobe signal DQS output from the memory device and received at the memory controller 800 at tSAC(min). In an example, DQS1 and DQS2 may be phase shifted signals (e.g., with a phase difference of 90°) such that the data strobe signal DQS output from the memory device may be delayed by the propagation time TPD, for example on a motherboard, in the conditions of tSAC (max) and tSAC(min) and the memory controller 800 may thereby adjust strobe data.

In the example embodiments of FIGS. 8 and 9, the memory controller 800 may estimate an arrival time (e.g., corresponding to three clock cycles and plus the propagation time TPD) for data output from a memory device (e.g., memory device 33, 35, 43, 600, 700, etc.) to be received at the memory controller 800. Thus, as illustrated in FIG. 9, the memory controller 800 of FIG. 8 may estimate that the data may be input at a time approximating time T4. However, the data arrival time may be further based on the interval TWIN (e.g., a difference between the value tSAC(max) and the value tSAC(min)) for the memory device.

In the example embodiments of FIGS. 8 and 9, the enable signals EN0, EN1, EN2 and EN3 may enable the latch circuits 86, 87, 88 and 89, respectively, based on DQS1 of tSAC(max) in FIG. 9. The enable signal EN0 may be disabled after the first flip-flop 861 of the first odd bit latch circuit 86 may receive the first data (e.g., the first odd bit) and may latch the first data at the first rising edge of DQS1. The enable signal EN1 may be disabled after the flip-flop of the first even bit latch circuit 87 may receive the second data (e.g., the first even bit) and may latch the second data at the first falling edge of DQS1. The enable signal EN2 may be disabled after the first flip-flop 881 of the second odd bit latch circuit 88 may receive the third data (e.g., the second odd bit) and may latch the third data at the second rising edge of DQS1. The enable signal EN3 may be disabled after the flip-flop of the second even bit latch circuit 89 may receive the fourth data (e.g., the second even bit) and may latch the fourth data at the second falling edge of DQS1.

In the example embodiment of FIGS. 8 and 9, the second flip-flop 862 of the first odd bit latch circuit 86 may latch the first data (e.g., the first odd bit) received by the first flip-flop 861. The second flip-flop 882 of the second odd bit latch circuit 88 may latch the third data (e.g., the second odd bit) received by the first flip-flop 881.

In the example embodiment of FIGS. 8 and 9, in order to transmit the data latched in the first odd bit latch circuit 86 and the first even bit latch circuit 87 to the first internal data latch circuit 91, the first internal clock signal CKS0 may be enabled. In an example, a time when the first internal clock signal CKS0 is enabled may lag behind at least the first falling edge of DQS1, and in other examples the time when the first internal clock signal CKS0 is enabled may lag past the second falling edge, the third falling edge, etc., because the first internal clock signal CKS0 may be enabled after the data may be latched in the second flip-flop 862 of the first odd bit latch circuit 86 and the first even bit latch circuit 87.

In the example embodiments of FIGS. 8 and 9, if the memory controller 800 receives data based on DQS2 (e.g., tSAC(min)), the enable signals EN0, EN1, EN2 and EN3 may be generated described above with respect to FIG. 8. However, in contrast to the above-given description, the first internal clock signal CKS0 may lead at least the third falling edge of DQS2 because the first data (e.g., the first odd bit) and the second data (e.g., the first even bit) may be transmitted to the first internal data latch circuit 91 when the first internal clock signal CKS0 may be enabled before the first data (e.g., the first odd bit) and the second data (e.g., the first even bit) latched in the second flip-flop 862 of the first odd bit latch circuit 86 and the first even bit latch circuit 87 may be written over with a fifth data (e.g., the third odd bit) and a sixth data (e.g., the third even bit). Accordingly, a rising edge of the first internal clock signal CKS0 may lag behind the first falling edge of DQS1 and may lead the third falling edge of DQS2.

In another example embodiment of the present invention, referring to FIGS. 8 and 9, if the interval TWIN is increased, a flip-flop for latching data may be included to the memory controller 800 such that the increased interval TWIN may not interfere with a correct receipt of data at the memory controller 800.

In another example embodiment of the present invention, a memory system (e.g., memory system 300, memory system 400, etc.) may include a data strobe output driver in a memory device which need not transition a data strobe signal to the higher impedance state during a standby period, but rather may transition the data strobe signal to the second logic level (e.g., a lower logic level). The data strobe signal may alternatively be transitioned to the higher impedance level in response to other triggering criteria. A data strobe bus line may thereby reduce power consumption during the standby period (e.g., reduced from VDD/2), which may likewise increase an operating efficiency of the memory system.

Example embodiments of the present invention being thus described, it will be obvious that the same may be varied in many ways. For example, while the first logic level is above-described as being a higher logic level and the second logic level is above described as being a lower logic level, it is understood that other example embodiments of the present invention may be configured for operation where the first logic level may indicate a lower logic level and the second logic level may indicate a higher logic level. Further, a voltage transition may indicate a change in voltage to arrive at a target voltage, but alternatively may indicate maintaining a voltage in order to remain at the target voltage. While above-described examples of the memory systems 300, 400, etc., have been given with a single memory controller and either one or two memory devices, it is understood that other example embodiments of the present invention may scale so as to include any number of memory controllers and/or memory devices. Further, while memory devices 600 and 700 have been given as examples for the memory devices 43 and 33/35, respectively, it is understood that other example embodiments of the present invention may include other memory devices. Further, while above-described example embodiments of the present invention are directed to memory systems using center-tap termination, it is understood that other example embodiments of the present invention may be directed to systems employing other termination methodologies.

Further, in another example embodiment of the present invention, the second logic level may correspond to a valid logic level, the valid logic level being a logic level sufficient to reduce a chance of a receiver (e.g., a memory device) misinterpreting noise on a bus as a transition signal.

Such variations are not to be regarded as departure from the spirit and scope of example embodiments of the present invention, and all such modifications as would be obvious to one skilled in the art are intended to be included within the scope of the following claims.

What is claimed is:

1. A memory device, comprising:
    a memory cell array;
    a data output buffer buffering data read from the memory cell array and outputting the buffered data to a data bus line; and
    a data strobe output buffer buffering at least one data strobe signal and outputting the buffered data strobe signal to a data strobe bus line, the data strobe output buffer first transitioning the at least one data strobe signal to a valid logic level during a standby state, the valid logic level being less than half of a power supply voltage.

2. The memory device of claim 1, wherein the standby state occurs after data is output from the data output buffer in response to a command.

3. The memory device of claim 2, wherein the command is a read command.

4. The memory device of claim 2, further comprising:
    at least one chip select pin;
    a plurality of command input pins;
    a data strobe signal pattern generator providing a toggling pattern corresponding to a burst length data outputted in response to the command to the data strobe output buffer as the at least one data strobe signal; and
    a command decoder decoding the command received through at least one of the plurality of command input pins and controlling the data strobe output buffer and the data strobe signal pattern generator based on the decoding.

5. The memory device of claim 4, wherein the command is a first read command input through the at least one of the plurality of command input pins, the data strobe output buffer performing the first transitioning to a first data strobe signal of the at least one data strobe signal at a first period of time after the read command and second transitioning the first data strobe signal to the valid logic level after a second period of time, the second period of time including the first period of time and a burst length wherein read data is output.

6. The memory device of claim 5, wherein a second read command is input to the through the at least one of the plurality of command input pins after the first read command, the data strobe output buffer third transitioning the first data strobe signal to the valid logic level after the second read command is input, toggling the first data strobe signal by a burst length for the second read command after a CAS latency in response to the second read command and fourth transitioning the first data strobe signal to the valid logic level after the toggling.

7. The memory device of claim 5, wherein a write command is input through the at least one of the plurality of command input pins after the first read command, the data strobe output buffer third transitioning the first data strobe signal to a higher impedance state after the write command.

8. The memory device of claim 4, wherein the command is a write command input through the at least one of the plurality of command input pins followed by a read command, the data strobe output buffer performing the first transitioning to a first data strobe signal of the at least one data strobe signal at a first period of time after the read command and second transitioning the first data strobe signal to the valid logic level after a second period of time, the second period of time including the first period of time and a burst length wherein read data is output.

9. The memory device of claim 2, wherein the memory device does not include a delay locked loop circuit.

10. The memory device of claim 2, wherein the data strobe output buffer second transitions the at least one data strobe signal to a higher impedance state during a pre-charge standby state, the second transitioning preceding the first transitioning.

* * * * *